T

(12) United States Patent
Quan et al.

(10) Patent No.: US 8,059,049 B2
(45) Date of Patent: Nov. 15, 2011

(54) DUAL BAND ACTIVE ARRAY ANTENNA

(75) Inventors: Clifton Quan, Arcadia, CA (US);
Fangchou Yang, Los Angeles, CA (US)

(73) Assignee: Raytheon Company, Walham, MA (US)

( * ) Notice: Subject to any disclaimer, the term of this patent is extended or adjusted under 35 U.S.C. 154(b) by 493 days.

(21) Appl. No.: 12/381,683

(22) Filed: Mar. 12, 2009

(65) Prior Publication Data
US 2009/0231226 A1  Sep. 17, 2009

Related U.S. Application Data

(63) Continuation-in-part of application No. 11/545,841, filed on Oct. 11, 2006, now Pat. No. 7,525,498.

(51) Int. Cl.
H01Q 13/18 (2006.01)
(52) U.S. Cl. .................. 343/770; 343/700 MS; 343/853
(58) Field of Classification Search .................. 343/700, 343/767, 770, 853
See application file for complete search history.

(56) References Cited

U.S. PATENT DOCUMENTS

| | | | |
|---|---|---|---|
| 3,587,105 A * | 6/1971 | Neilson | 343/710 |
| 4,644,366 A * | 2/1987 | Scholz | 343/895 |
| 4,990,926 A | 2/1991 | Otsuka et al. | |
| 5,079,557 A | 1/1992 | Hopwood et al. | |
| 5,166,864 A | 11/1992 | Chitwood et al. | |
| 5,315,480 A | 5/1994 | Samarov et al. | |
| 5,353,031 A | 10/1994 | Rathi | |
| 5,403,973 A | 4/1995 | Santilli et al. | |
| 5,631,446 A | 5/1997 | Quan | |
| 5,829,512 A | 11/1998 | August | |
| 6,249,260 B1 * | 6/2001 | Holloway | 343/795 |
| 6,351,244 B1 | 2/2002 | Snygg et al. | |
| 7,057,563 B2 * | 6/2006 | Cox et al. | 343/700 MS |
| 2005/0264448 A1 | 12/2005 | Cox et al. | |
| 2007/0153481 A1 | 7/2007 | Touzov | |

FOREIGN PATENT DOCUMENTS

| | | |
|---|---|---|
| FR | 2867614 | 9/2007 |
| GB | 2 397 697 A | 7/2004 |
| WO | WO 02/19469 A | 3/2002 |
| WO | WO 2008/045349 A1 | 4/2008 |

OTHER PUBLICATIONS

Microwave and Optical Technology Letters, vol. 49, No. 1, Jan. 2007, "Microstrip-Fed Slot Antennas Backed by a Very Thin Cavity," Vallecchi, et al., pp. 247-250. Antenna Engineering Handbook, Henry Jasik, Editor, McGraw-Hill, 1961, Chapter 8, Slot Antennas by Judd Blass, pp. 8-1 through 8-4.
Pokuls, et al., "Dual-Frequency and Dual-Polarization Microstrip Antennas for SAR Applications" IEEE Transactions on Antennas and Propagation, vol. 46, No. 9, Sep. 1998 (pp. 1289-1296).
Extended European Search Report for Corresponding European Application No. 10250461.0, extended European Search Report dated Sep. 15, 2010 and mailed Sep. 21, 2010 (8 pgs.).

* cited by examiner

*Primary Examiner* — Tho G Phan
(74) *Attorney, Agent, or Firm* — Christie, Parker & Hale, LLP

(57) ABSTRACT

An exemplary embodiment of a dual band antenna array includes a folded thin circuit board structure with a thin dielectric layer and a conductor layer pattern formed on a first surface of the dielectric layer, the circuit board structure folded in a plurality of folds to form a pleated structure. A first array of radiator structures on the first surface is configured for operation in a first frequency band in a first polarization sense. A second array of radiator structures is configured for operation in a second frequency band in a second polarization sense. A conductor trace pattern is formed on the folded circuit board to carry control signals, DC power and RF signals. Active RF circuit devices are attached to the folded circuit board in signal communication with the conductor trace pattern.

22 Claims, 16 Drawing Sheets

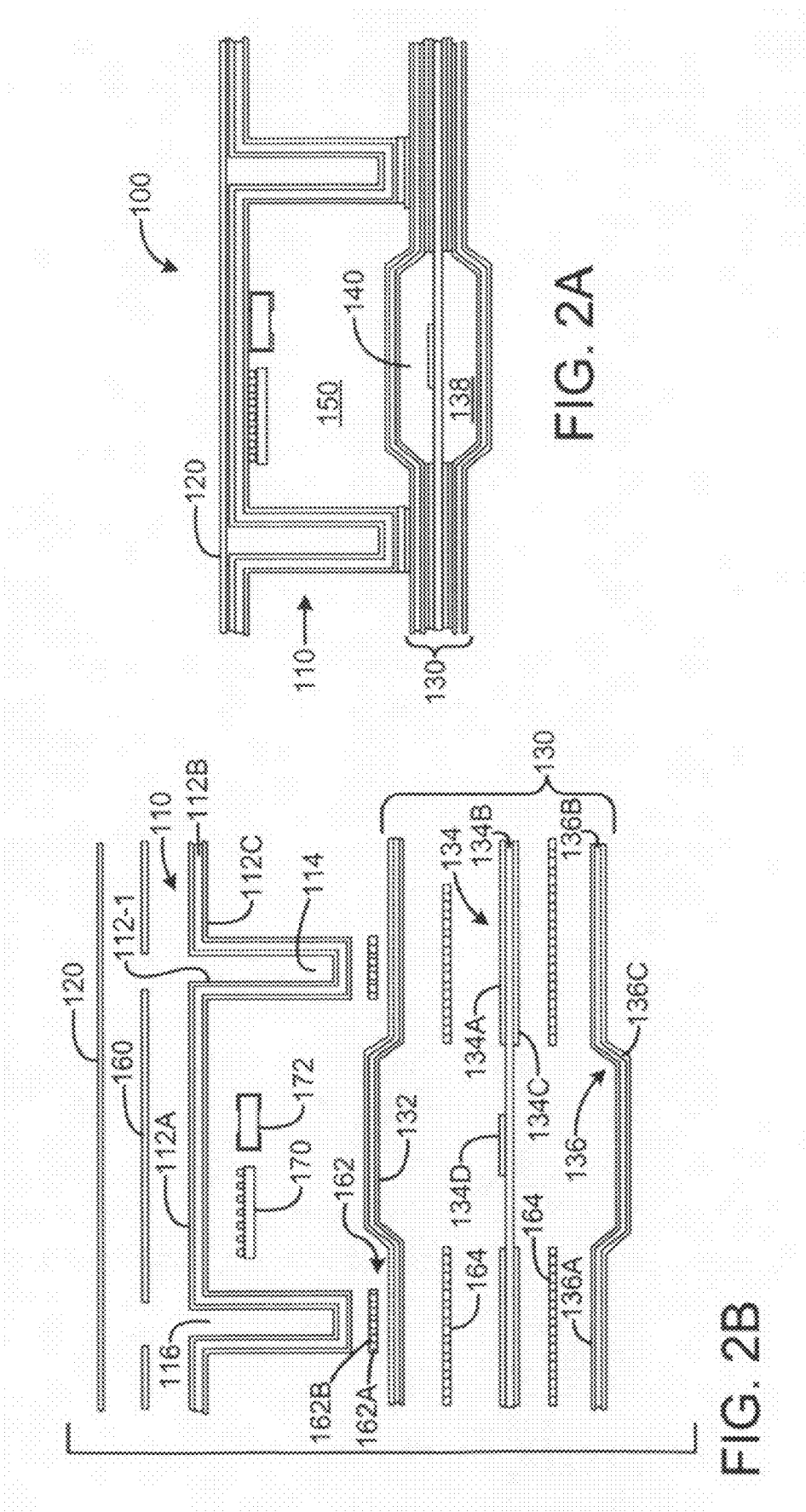

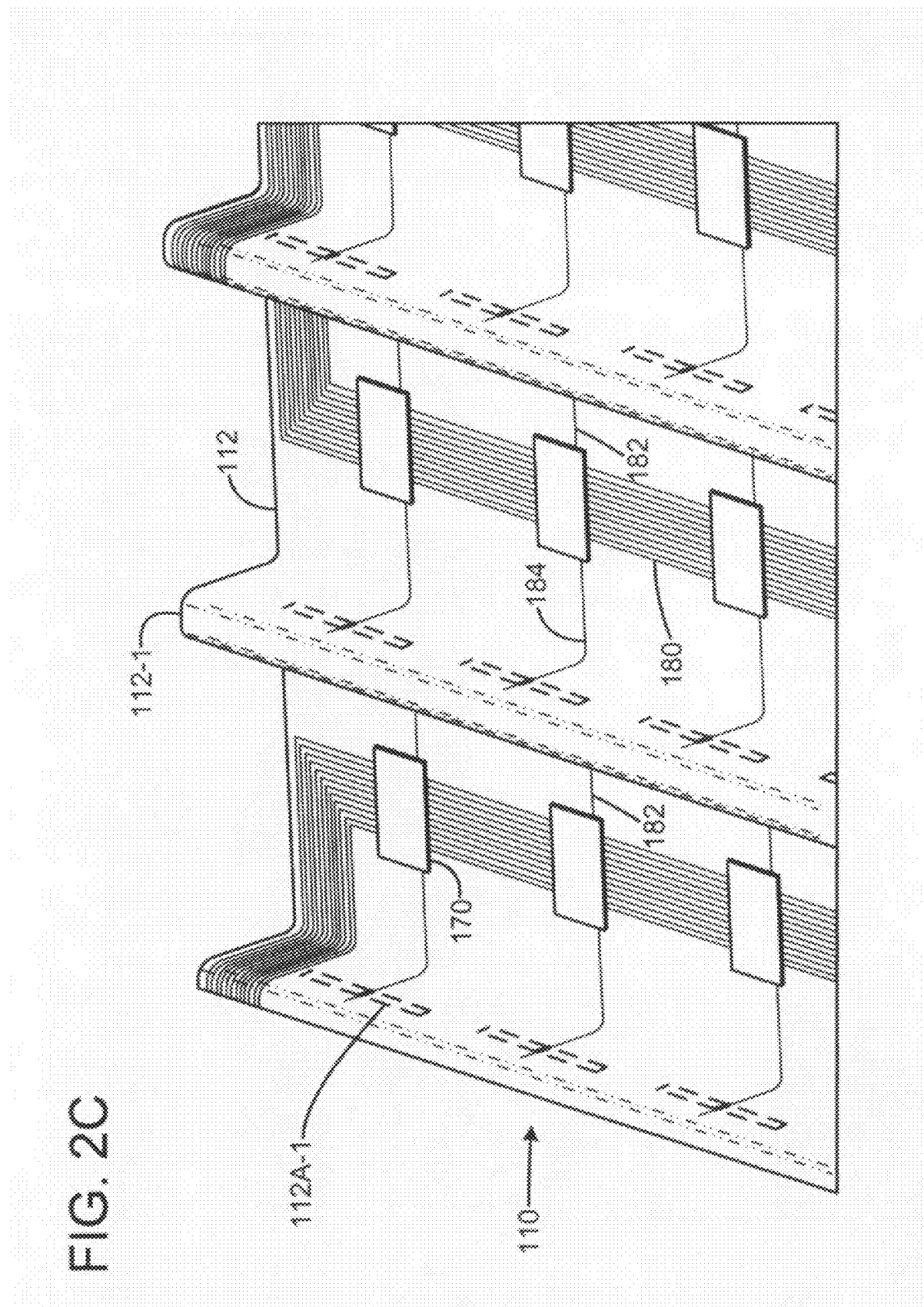

FIG. 9
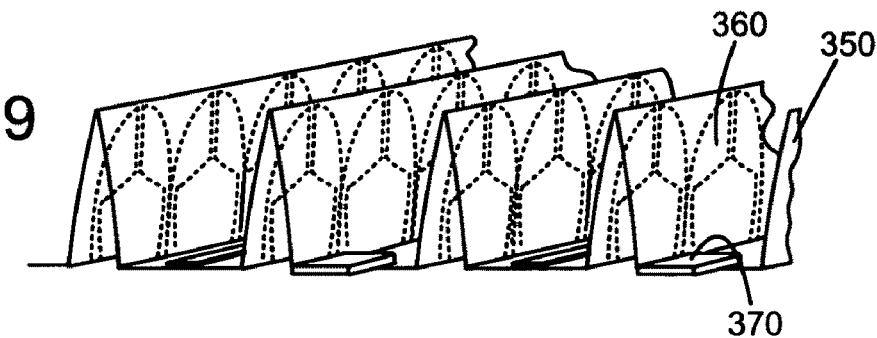
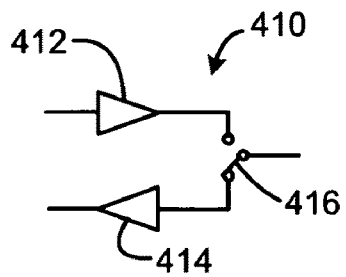
FIG. 10B
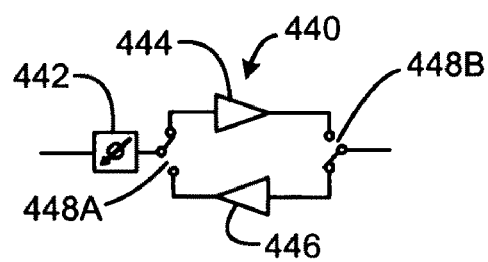
FIG. 10C
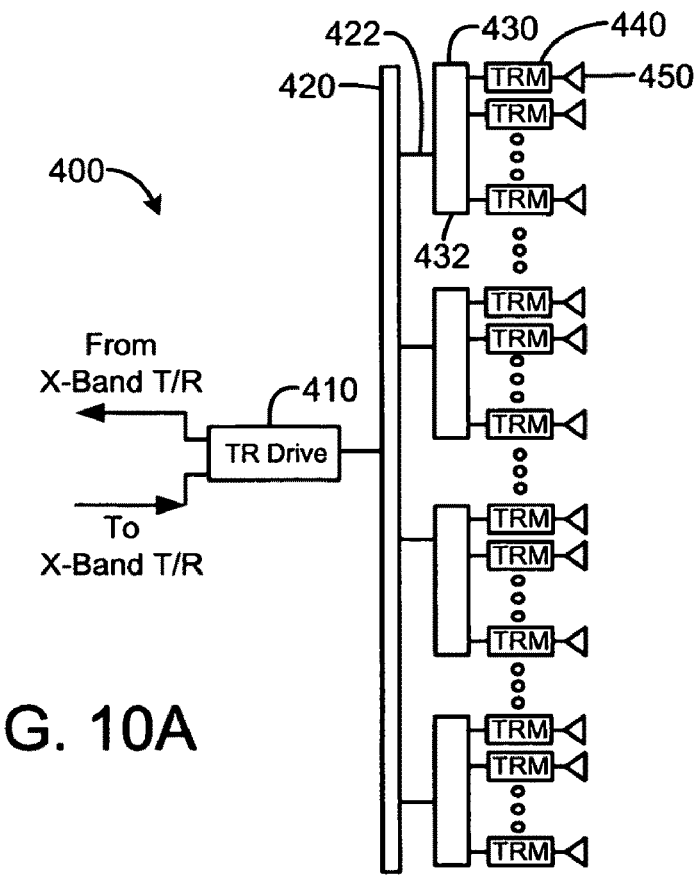
FIG. 10A

US 8,059,049 B2

DUAL BAND ACTIVE ARRAY ANTENNA

CROSS-REFERENCE TO RELATED APPLICATION

This application is a continuation-in-part of application Ser. No. 11/545,841, filed Oct. 11, 2006 now U.S. Pat. No. 7,525,498.

This invention was made with Government support under Contract No. FA8750-06-C-0048 awarded by the Department of the Air Force. The Government has certain rights in this invention.

BACKGROUND

Next generation large area multifunction active arrays for such exemplary applications as space and airborne based antennas for radar and communication systems, including platforms such as micro-satellites and stratospheric airships, may be lighter weight, lower cost and more conformal than what can be achieved with current active array architecture and multilayer active panel array development.

SUMMARY OF THE DISCLOSURE

An exemplary embodiment of a dual band antenna array includes a folded thin circuit board structure with a thin dielectric layer and a conductor layer pattern formed on a first surface of the dielectric layer, the circuit board structure folded in a plurality of folds to form a pleated structure. A first array of radiator structures on the first surface is configured for operation in a first frequency band in a first polarization sense. A second array of radiator structures is configured for operation in a second frequency band in a second polarization sense. A conductor trace pattern is formed on the folded circuit board to carry control signals, DC power and RF signals. Active RF circuit devices are attached to the folded circuit board in signal communication with the conductor trace pattern.

BRIEF DESCRIPTION OF THE DRAWINGS

Features and advantages of the disclosure will readily be appreciated by persons skilled in the art from the following detailed description when read in conjunction with the drawing wherein:

FIG. 2A is an end view of the array of FIG. 2. FIG. 2B is an exploded diagrammatic end view of the array portion of FIG. 2A. FIG. 2C is a diagrammatic isometric view, illustrating features of an exemplary embodiment of the subarray structure of FIG. 2.

FIG. 9 is an isometric view of an exemplary embodiment of a folded flexible circuit board employing flared dipole radiators.

FIGS. 10A-10C are schematic block diagrams illustrating features of an exemplary embodiment of an active array sub-panel RF circuit.

DETAILED DESCRIPTION

Figure 1:
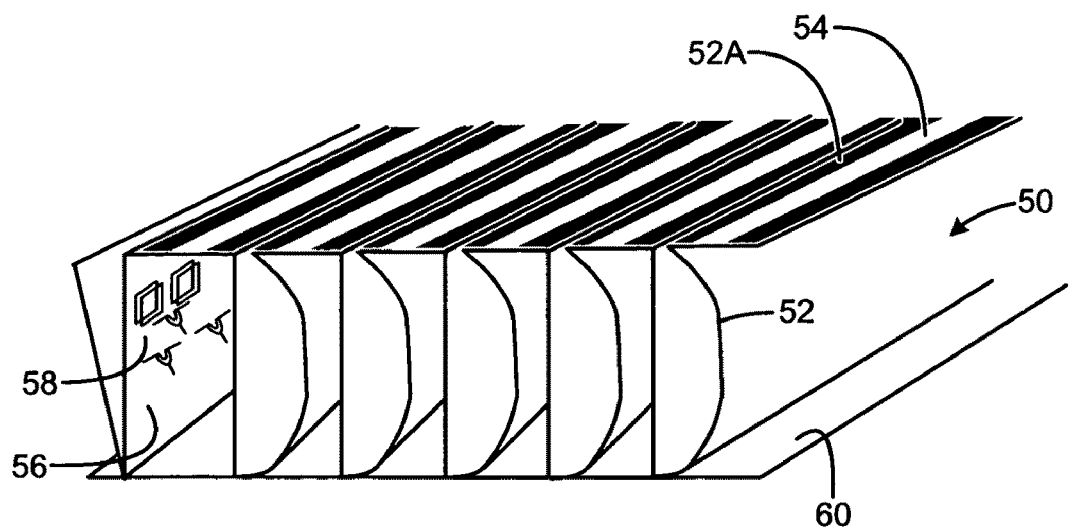
FIG. 1 is an isometric view illustrating an array architecture employing a subarray formed by a folded continuous roll or sheet of a flexible circuit board.

In the following detailed description and in the several figures of the drawing, like elements are identified with like reference numerals. The figures are not to scale, and relative feature sizes may be exaggerated for illustrative purposes.

An exemplary embodiment of an array antenna architecture may employ radiators, e.g. long slot radiators, formed by folding a thin conductor cladded RF flexible circuit laminate sheet, resulting in a pleated, origami-like appearance, which may sometimes be referred to as an "origami" assembly or origami panel array. The control signals, DC power and RF feed circuit traces may be formed or deposited on this single core laminate sheet together with T/R (transmit/receive) MMICs (monolithic microwave integrated circuits). In an exemplary embodiment, the integrated flexible circuit radiator laminate sheet may be joined to a second layer of flexible circuit laminate containing a second feed layer, e.g., in a non-limiting example, an air stripline feed. In an exemplary embodiment, vertical interconnects are not employed within the folded flexible circuit radiator laminate sheet, significantly reducing the production cost of the array. A non-limiting exemplary embodiment of an array may be about 1 cm thick with a weight of 1.2 kg per square meter. The shape of the flexible circuit may be selected to create the radiator within the fold and on the opposite side of the manifold circuitry, so that the two are shielded from each other. This construction may be fabricated as a single aperture or broken up into subarray panels.

An exemplary non-limiting embodiment of an array antenna integrates the radiator, an RF level one feed network, control signals, and DC power manifold with a single layer of flexible circuit board. In an exemplary embodiment, the assembly may be fabricated without a single conductive via through the layer. FIG. 1 is an isometric view of an exemplary embodiment illustrating an array 50. The array is fabricated using origami-like folding of the flexible circuit board 52 to effectively increase the area to route all the RF, signal, and power lines onto a single layer, without increasing the array lattice area or using any vias within the RF flexible circuit board.

In the exemplary embodiment of FIG. 1, the flexible circuit board 52 is fabricated of a flexible dielectric layer having a layer of conductive material, e.g. aluminum or copper formed on the outer surface. The flexible dielectric layer may be, for example, polyimide, polyethylene, liquid crystal polymer (LCP), Teflon® based substrates, or any organic substrate material of thickness from 5 micro-inches to 5000 micro-inches. The flexible dielectric layer may be, in exemplary embodiments, either in sheet format of up to 36 inches by 36 inches or in roll format several feet wide by 1000's of feet long. These dimensions are non-limiting, and merely given as examples. In an exemplary embodiment, the conductive layer may be selectively removed in elongated areas 54 which are parallel to the folds to form long slot radiators which are positioned at the top of each fold of the origami array 50. Positioned on the opposite surface 56 of the flexible circuit board 52 are RF circuitry, signal lines, and power lines, generally depicted by reference 58 in FIG. 1, for the array. A second circuit board 60 may be attached to the folded circuit board 52 to provide additional circuitry, e.g. for a second level feed network, e.g. a row feed network, in an exemplary embodiment. The board 60 may be flexible or rigid, and may be adhesively attached in an exemplary embodiment.

Figure 2:
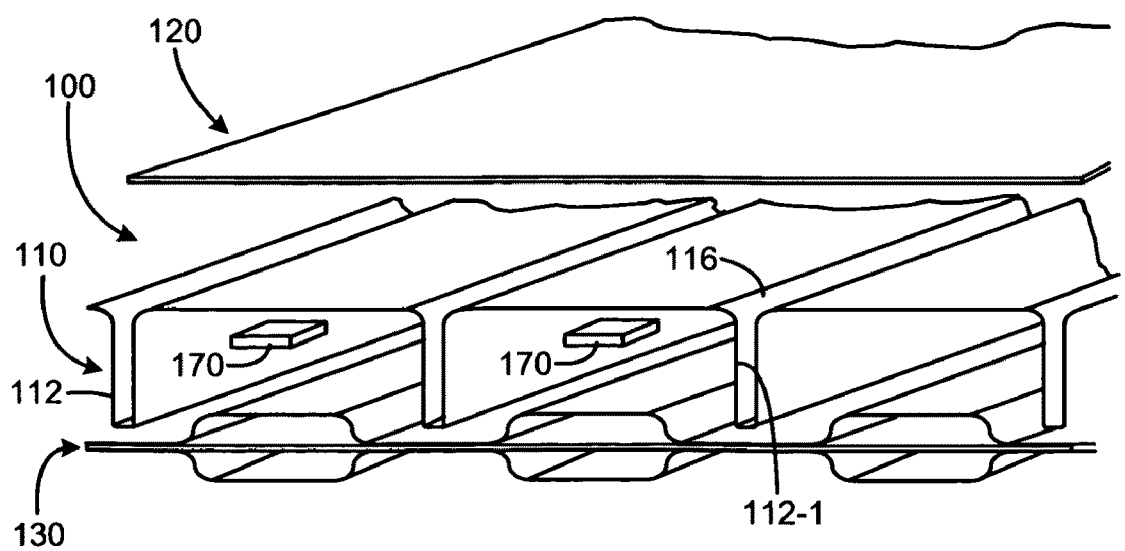
FIG. 2 is an isometric exploded view of elements of an exemplary embodiment of a lightweight array panel.

In an exemplary, non-limiting embodiment, the shape of the origami folds within the RF flexible circuit, e.g. as shown in the exemplary embodiment of FIG. 2, may be that of a cavity backed long slot radiator. This results in having the radiating aperture and the distribution manifolds shielded from each other. TR module chips and capacitors may be mounted onto the three-dimensional (3-D) folded RF flexible circuit using methods such as, by way of non-limiting examples, epoxy or solder attachment of integrated circuits or packaged surface mount components, electrically connected by wired bond or flip chip attachment. The 3-D folding of the RF flexible circuit may enable the incorporation of additional physical features such as enhanced structure support, conformality to two-dimensional (2-D) and 3-D surfaces, and allowance of physical expansion and contraction due to stresses applied to the array during deployment or operation. The integration of functionality for the RF, control and power distribution may eliminate the need for several layers of circuit boards, adhesive bonding films and hundreds of thousands of plated via as typically employed in a multilayer PCB. The result is a simplified construction of an active array panel that is light in weight.

Additional array functional and mechanical features may be incorporated onto the basic origami array or subarray by integrating additional layers of 3-D folded RF flexible circuit boards or simple flat sheets of RF flexible circuit boards.

FIGS. 2-2C illustrate features of an exemplary embodiment of an array 100, comprising an origami subarray 110. The subarray 110 includes a thin laminate sheet 112, which may include a flexible dielectric substrate 112B, with a conductive layer pattern 112A formed on a first, top surface of the dielectric sheet and a conductor pattern 112C formed on a second, lower surface of the dielectric substrate. The sheet 112 has a plurality of parallel folds or pleats 112-1 formed therein. The folds 112-1 define cavities 114.

Suitable techniques for forming the sheet into the origami folded structure may include as exemplary, non-limiting examples, molding using hard die tooling as in a waffle iron or through continuous folding across a mandrill or straight edge blade, sometimes with localized application of heat. Control of the shape may be dependent on the base material of the sheet. For example, in the case of LCP, the shape may be accomplished via cross linking polymers at elevated temperature in a molding process. Other materials may be "creased" to ensure proper shape outline and then through an additional polymer layer attachment, held in place much like a Venetian blind or an open cell structure as in a honeycomb.

In an exemplary embodiment, in which the radiator structures are cavity backed long slot radiators, the conductive layer pattern 112B may be a continuous ground plane layer with a set of relieved areas or windows formed therein for allowing excitation by a set of probes on the opposite side of the dielectric layer.

A single layer of RF flexible circuit board may be attached to the top of the origami subarray to form a radome 120. Exemplary radome materials may vary, from thin 0.001 inch thick polyimide to several inch thick sandwich materials made up of various polymers or esters. The radome materials may typically be chosen to reduce RF loss or to help match the radiating aperture to free space. Solar reflectors are typically polymer films such as, for example, polyesters or acrylate films, either single layered or multilayer.

The array 100 may further include, in an exemplary non-limiting embodiment, a second level manifold and face sheet structure 130, fabricated in an exemplary embodiment as a combination of three layers 132, 134, 136 (FIG. 2B) of 3-D folded/formed flexible circuit sheets to form a second level RF feed network as well as provide control signal and DC power lines. The second level structure 130 may be assembled to the origami subarray 110, and may be used in an exemplary embodiment to serve several origami subarrays in combination to form a single large area aperture assembly. For some applications, the structure 130 may not be included.

Figure 3:
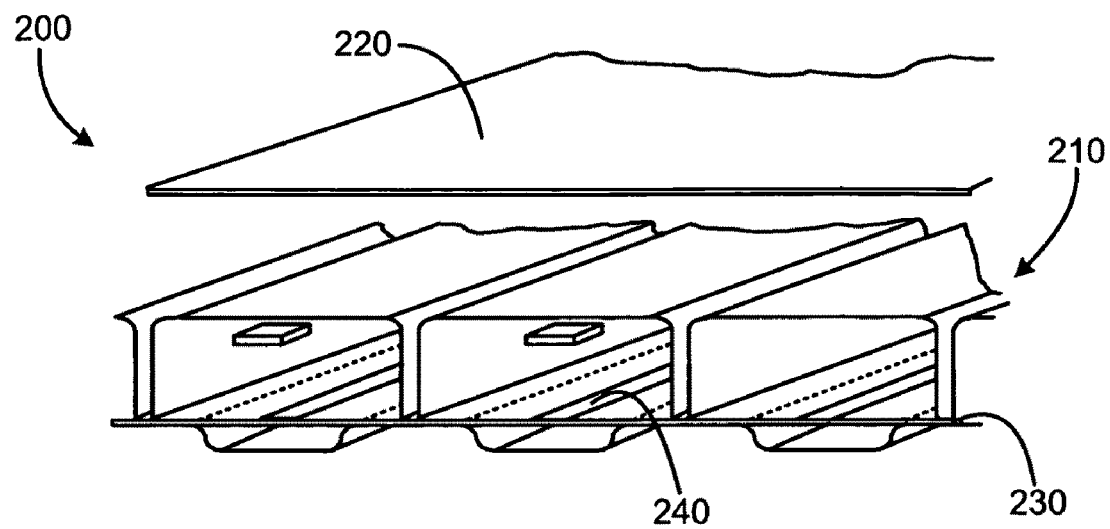
FIG. 3 is an exploded view of a portion of another exemplary embodiment of an array including a subarray formed from a continuous flexible circuit board.

In an exemplary embodiment, the second level structure 130 may utilize low loss airstripline transmission lines 140 to distribute RF signals, e.g. to the various origami subarrays. The RF flexible circuit boards 132, 136 are shaped to form metalized air channels 138 around the air stripline circuit traces. Suspended microstrip transmission lines can also be used to realize a second level RF feed, as depicted in FIG. 3. The assembly of the origami subarray 110 and the second level structure 130 forms shielded cavities/channels 150 (FIG. 2A) to reduce electromagnetic interference (EMI).

As illustrated in the exploded view of FIG. 2B, in an exemplary embodiment, attachment of radome 120 to the subarray 110, and of the subarray 110 to the second level structure 130 may be accomplished by adhesives. A structural adhesive layer 160 may be employed to attach the radome 120 to the origami subarray 110.

The origami subarray 110 may be fabricated with a flexible circuit board including a dielectric layer 112B, a groundplane layer 112A formed on an upper surface of the dielectric layer, e.g. an aluminum layer. The folding of the structure 110 creates X band long slot radiators 116 in the "creases" or folds 112-1 of the folded circuit board. The undersurface of the dielectric layer 112B has formed thereon a conductor pattern defining an RF, e.g. X band, level one feed network with signal and power line manifolds.

A structural and conductive adhesive layer 162 may be used to bond the second level feed structure 130 to the first level feed network fabricated on the origami subarray 110. The structural adhesive may be in a form of a "prepreg" layer 162A and may have holes cut in it for the placement of conductive adhesive portions 162B, to make selective electrical contacts between control signal and power lines in the structure 110 and structure 130. "Prepreg" (preimpregnation) refers to a resin based material sometimes with a mat or woven fabric used to combine layers of polymer into a monolithic structure. The conductive adhesive may be screened on after placement of the structural prepreg layer. When cured, i.e. processed by thermally accelerating the hardening of adhesive epoxies, the conductive adhesive may provide the path for both the signal and power lines. An RF connection may be obtained by capacitive coupling between two pads placed on the level one and level two feeds.

FIG. 2C illustrates a fragment of an exemplary embodiment of the subarray structure 110, showing the underside of the flexible circuit board assembly 112 having fabricated thereon conductor pattern 180 for conducting power and control signals to active devices 170 mounted on the substrate 112. The active devices may include T/R module MMIC chips, for example. The underside of the substrate also has fabricated thereon a conductor pattern 182 which forms a first level RF feed network interconnecting the active devices 170 with a second level RF feed network formed on the second level structure 130. Also fabricated on the substrate are conductor traces 184 connected to the active devices 170 and include portions which act as radiator structure probes. The conductor traces 184 pass over slots or windows 112A-1 formed in the conductive layer 112B (FIG. 2B) on the opposite surface of the structure 110. These probes 184 excite the cavities of the long slot radiators.

FIG. 3 is an isometric view of an alternate exemplary embodiment of an array architecture 200, which is similar to the array 100 of FIG. 2, except that the second level feed structure 230 employs a suspended microstrip transmission line structure 240 to realize the second level RF feed structure 230.

FIGS. 4-7 illustrate an exemplary embodiment of an interconnection of the control signal and DC power lines to transmit/receive (T/R) chips 170 mounted on the origami subarray 110. In this embodiment, the control signal and DC power lines are run serially to the TR module chips 170 along the 3-D origami subarray panel substrate 112. The signal and power lines and TR chip I/O's generally comprising manifold 180 may be orthogonal to the RF lines and I/O's of the feed network 180 that run from the first level RF feed and radiator transition to avoid cross-overs and via interconnects within the RF flexible circuit board 112. Microstrip transmission line may be used for the first level RF feed network 180, as it can be routed along the folded RF flexible circuit board 112. Because the manifold circuitry is placed along the side of the long slot radiators, there is no increase in the thickness of the antenna; for X-band the thickness of the origami panel in an exemplary non-limiting embodiment may be a little over a centimeter, exclusive of side electronics. The radiator transition may incorporate a microstrip transmission line 182 running from the TR chips 170 along the RF flexible circuit board coupling to either a slot 112A-1 located along the side of the radiator cavity or a probe 184 the runs across the top of the cavity.

Figure 4:
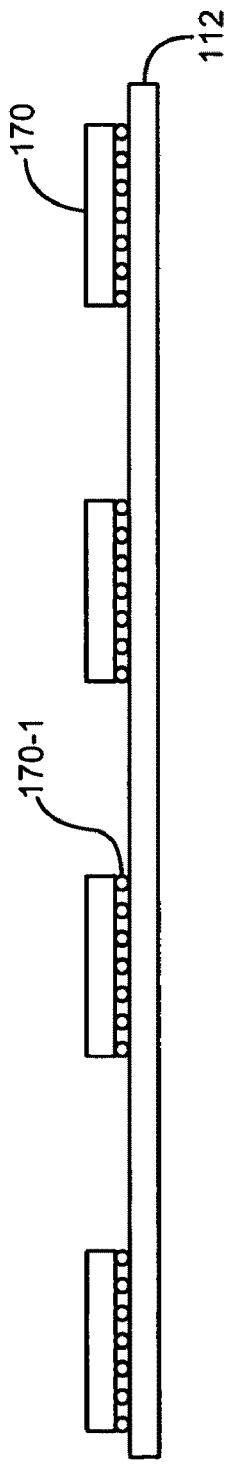
FIG. 4 is a diagrammatic side view illustrating an exemplary mounting arrangement for T/R module chips on a panel array assembly.

FIG. 4 diagrammatically depicts an exemplary embodiment of a technique for attaching RF circuit devices 170 to an array substrate 112. In this example, the devices 170 may be MMIC chips, mounted to the substrate 112 by conductor pads 170-1. These MMIC chips may provide T/R module functions, e.g. for an X-band array frequency regime.

Figure 5:
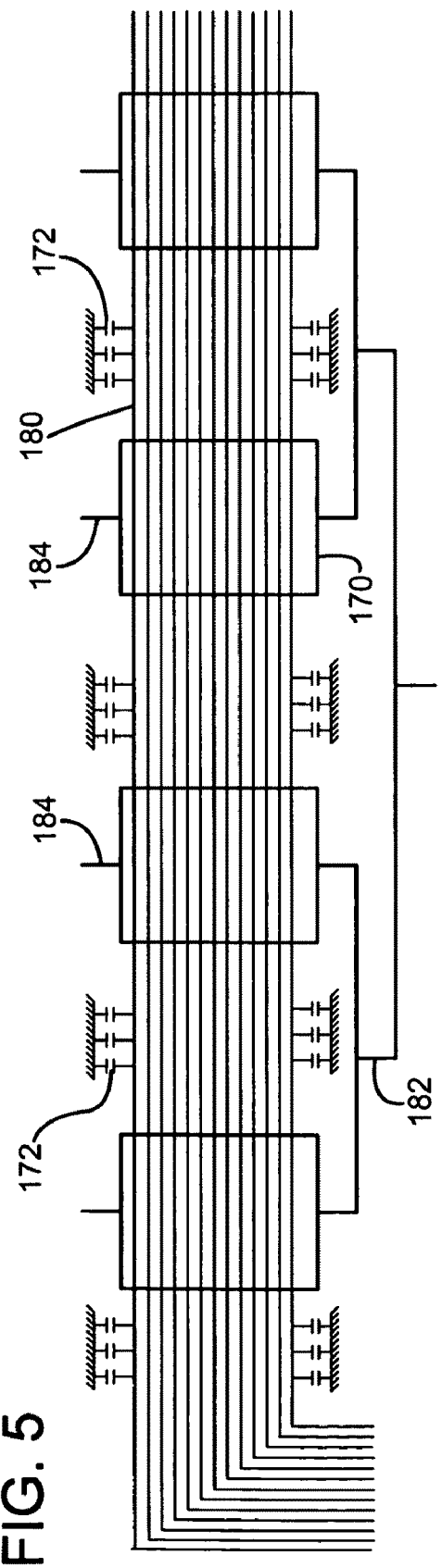
FIG. 5 is a diagrammatic schematic diagram illustrating an exemplary control signal and DC power manifold arrangement for a portion of an array assembly.

FIG. 5 is a top view depiction of an exemplary embodiment of a portion of the circuitry formed on the underside of the substrate 112 along one fold or pleat of the origami substrate structure. A conductor trace pattern defines the control signal and power manifold 180 which series connects the active devices 170 attached to the substrate 112. An RF level one feed network depicted as 182 provides RF signals to the active devices 180, with RF probe conductors 184 connected to the active devices 180.

Figure 6:
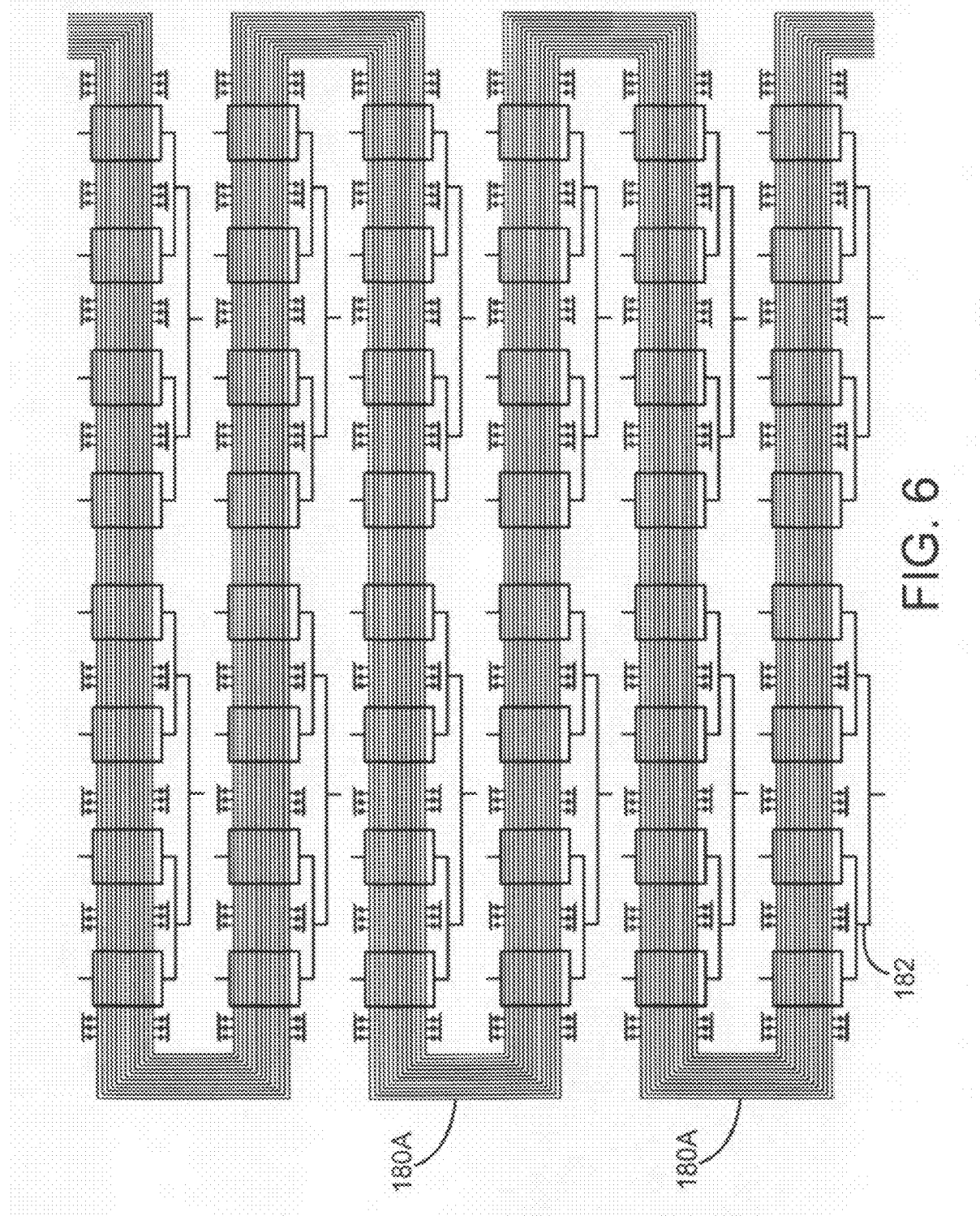
FIG. 6 is a schematic diagram of an exemplary embodiment of power and control signal lines for the T/R modules of a panel array assembly.

FIG. 6 is a top view depiction of an exemplary embodiment of a larger portion of the circuitry depicted in FIG. 5, for several adjacent folds or pleats in the substrate structure 110. The series connection of the control signal and power manifold may be extended from one column area between two adjacent folds to the next column area by passing the transverse conductor pattern portion 180A under one fold to connect to the parallel conductor pattern portions in the adjacent column areas. The level one RF feed network 182 is also depicted.

Figure 7:
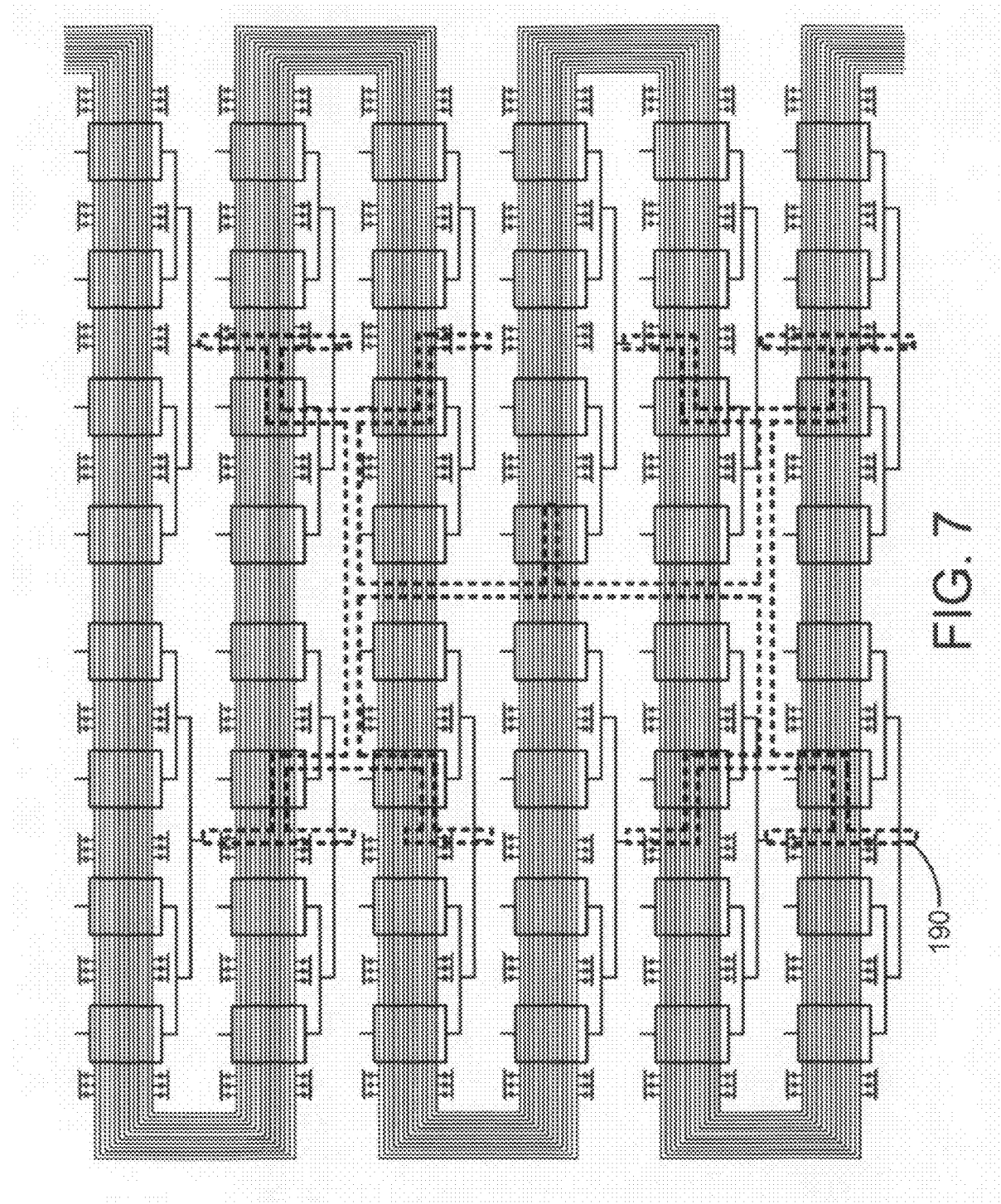
FIG. 7 is a schematic diagram similar to FIG. 6, showing an exemplary embodiment of a second level RF feed network.

FIG. 7 is a view similar to that of FIG. 6, with an exemplary embodiment of a second level RF feed network 190 depicted in dashed lines. The network 190 is fabricated on or in the second level structure 130, including the transmission line 140.

Figure 8:
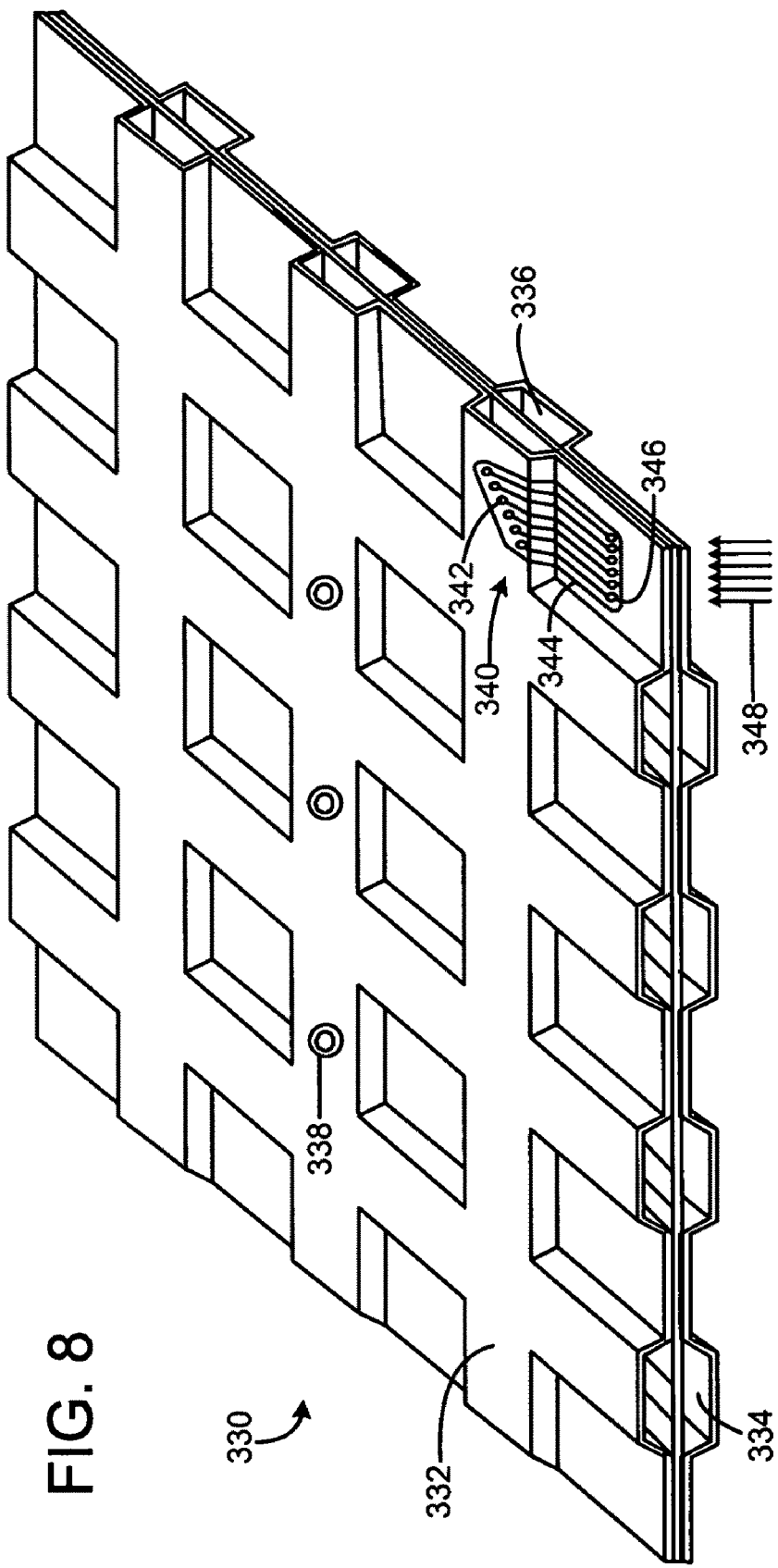
FIG. 8 is a diagrammatic isometric view of an exemplary embodiment of a base structure for an exemplary panel array assembly.

An exemplary alternative embodiment of a second level structure is depicted in FIG. 8, as structure 330. An origami panel structure such as panel 110 may be attached to the structure 330 in a manner similar to that depicted in FIG. 2, except that the folds of the panel 110 are attached to the structure 330 at the raised areas above the suspended stripline channels. The structure 330 has a "waffle" pattern facilitating fabrication of the stripline channels 334, 336 in two, transverse directions. Conductive vias 338 may be formed in the top layer of the structure 330 to provide electrical interconnection from the top surface to another layer of the structure. The structure 330 illustrates a fragment of an exemplary conductor pattern 340 which may interconnect to the conductor pattern fabricated on the matching origami subarray structure. The conductor pattern may include, for example, conductor pads 342 which electrically connect to pads in the conductor pattern of the origami subarray through z-axis conductive adhesive, for example, when the structure 330 is assembled to the subarray. The conductor pattern 340 further includes conductor lines 348 which run to a set of vias 346. Electrical connections may be made to the conductor pattern on opposite ends of the vias 346 on the underside of the structure 330. The conductor pattern may be extended or replicated as needed over areas of the structure 330.

Other types of radiators may be folded within the origami panel subarray beside the long slot radiators. FIG. 9 depicts flared dipole radiators 360 incorporated into a folded RF flexible circuit board assembly 350. T/R module chips 370 are mounted on flat surfaces of the circuit board assembly 350.

An exemplary RF architecture for an exemplary embodiment of an origami active sub-panel array is illustrated in FIGS. 10A-10C. FIG. 10A depicts an exemplary block diagram for an RF active array system 400. The system includes a transmit/receive (T/R) drive circuit 410, depicted in further detail in FIG. 10B, which is connected to an exemplary second level feed network 420 for the sub-panel array 400. The T/R drive circuit 410 receives an input drive signal from an RF exciter such as an X-band exciter, and routes received signals from the T/R modules to a receiver circuit such as an X-band receiver. The feed network 420 has I/O ports 422 connected respectively to I/O ports of the first level RF feed network 430. The first level RF feed network has I/O ports 432 which are connected in turn to the transmit/receive (T/R) module chips 440 mounted on the origami panel circuit board. The radiators 450 are connected to the T/R module chips.

FIG. 10B illustrates a schematic functional block diagram of an exemplary embodiment of a T/R drive circuit 410, which includes a power amplifier 412 for amplifying exciter signals, a low noise amplifier 414 for amplifying received signals, and a switch 416 for selecting transmit or receive channels.

FIG. 10C illustrates a schematic functional block diagram of an exemplary embodiment of a T/R module chip 440, which includes a power amplifier 446 for amplifying transmit signals from the T/R drive circuit 410, a low noise amplifier 446 for amplifying received signals from the radiator 450, and switches 448A, 448B for selecting either the transmit channel or the receive channel. The chip 440 also includes a variable phase shifter 442.

Figure 11:
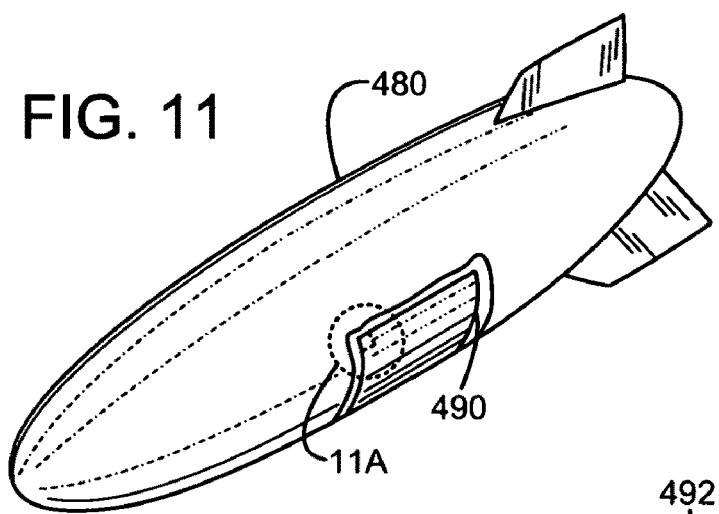
FIG. 11 is an isometric view of an airship employing an exemplary embodiment of a panel array assembly.
Figure 11A:
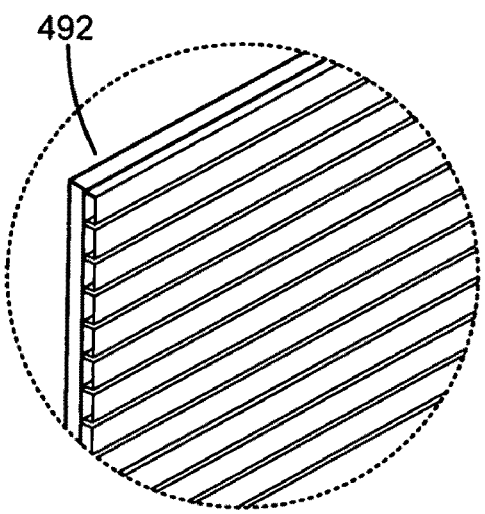
FIG. 11A is an isometric view of a portion of the panel array assembly within circle 11A of FIG. 11.

One exemplary application for an origami array antenna is the construction of a thin light weight active array antenna 490 mounted on the skin of an airship 480 as shown in FIGS. 11 and 11A. In this example the antenna may incorporate hundred of individual origami active panels 492 mounted onto the skin.

Connection of the power, signal and RF lines from the airship to the level two feed on the panels may be accomplished by use of low profile connectors. A straight, surface mount GPPO-style RF connector is both lightweight and low loss. A right angle button style fitting on the mating connector may provide a light weight yet easily routable cable solution. For the power and signal lines a standard low profile, light weight, surface mount microD connector may be used. The microD connector can be oriented as either straight or right angle to best facilitate cable routing.

Thin RF flexible circuit technologies may be employed in the fabrication of thin ultra-lightweight flexible active panel array antennas. Applying 3-D circuitry onto a folded/formed RF flexible layer may be a key enabler to integrations of both electrical and mechanical functions. This may result in a significant reduction in the number of dielectric, conductor, and adhesive layers. Also the number of interconnects may be almost eliminated and in an exemplary embodiment may be principally located in the second level RF feed.

In a further embodiment, a second active array, e.g. in a non-limiting application, operating in a UHF frequency band, is included with the origami active array, e.g. one operating at X-band, such that there is little or no increase in depth and slight increase in weight due to an additional set of T/R modules for the second array. For the exemplary airship installation application, a second active array may be integrated into the origami panel without little or no increase in thickness or weight. In an exemplary embodiment, the second array may be implemented by slot radiating elements defined by openings within or between the folded layers of the origami panels. With the second array slot elements spaced apart by about a one foot distance in an exemplary embodiment for UHF operation, there is sufficient room to mount TR module chips and to route the RF, control and DC power lines on a single layer on the back of the origami panel for the UHF array.

Figure 12:
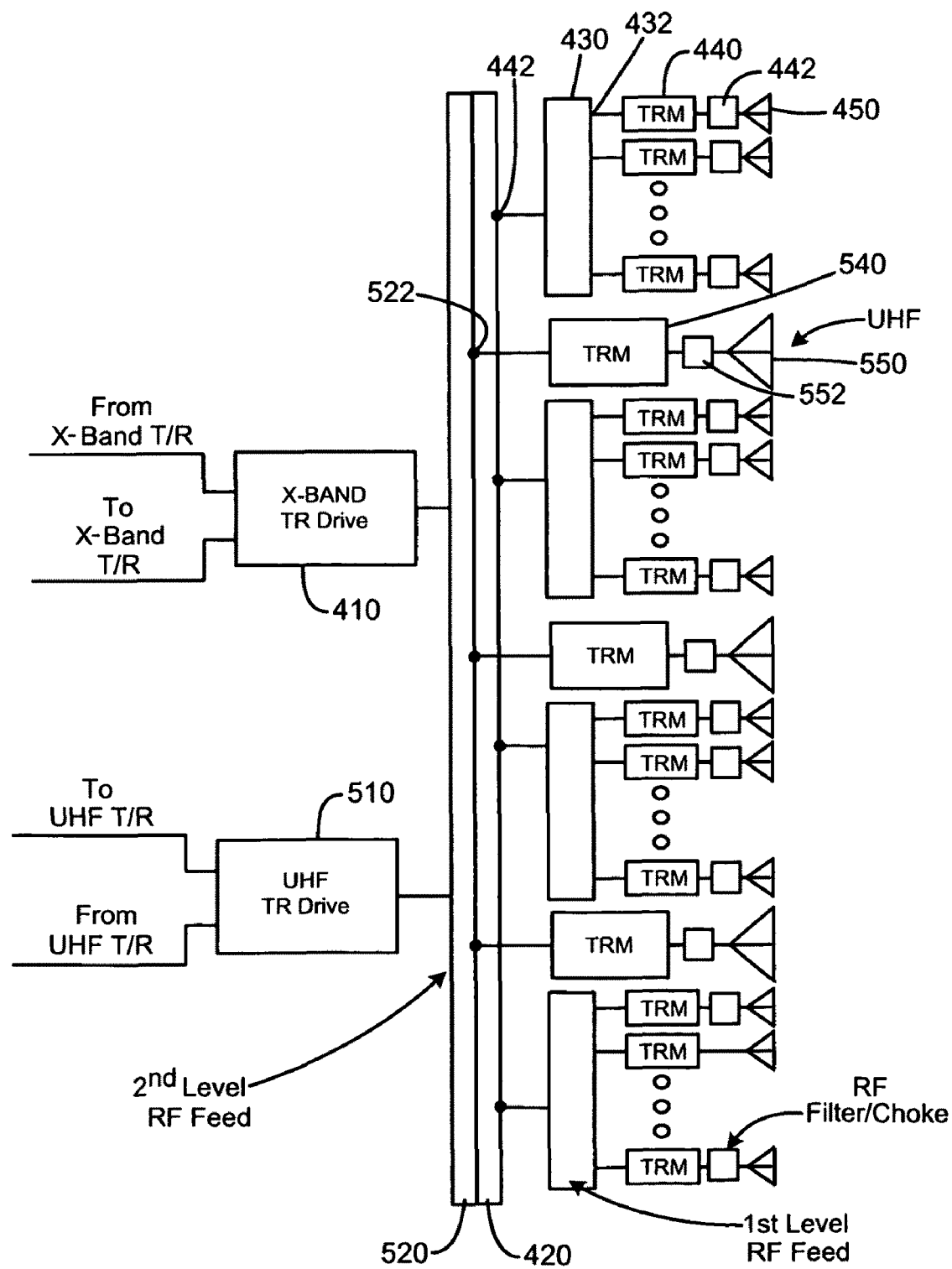
FIG. 12 is a schematic block diagram illustrating features of an exemplary embodiment of a dual band active array sub-panel RF architecture.

Thus, in a further exemplary embodiment, the origami X-band active array panel architecture as described above regarding FIGS. 1-11B has an additional UHF active array integrated within the layers of the X-band panel. In an exemplary embodiment, this may be accomplished without increase of panel thickness and with only a slight increase in weight due to the additional UHF TR modules 540 as illustrated in FIG. 12. From an RF architecture standpoint, these may be considered as two separate RF array antennas but physically co-located and integrated with the same origami panel while sharing power and digital control electronics. In an exemplary embodiment, the UHF radiating elements 550 may be interleaved between the X-band radiating elements in such a way as to minimize the periodic discontinuity on the UHF elements on the X-band radiation patterns.

FIG. 12 illustrates schematically an exemplary architecture of a dual band active array system, in elevation view, for a sub-array panel. The X-band array includes the elements described above regarding the embodiment of FIGS. 10A-10C. Thus, the X-band array includes a transmit/receive (T/R) drive circuit 410 connected to an exemplary second level feed network 420 for a sub-panel array. The T/R drive circuit 410 receives an input drive signal from an RF exciter such as an X-band exciter, and routes received signals from the T/R modules 440 to a receiver circuit such as an X-band receiver. The second level feed network 420 has I/O ports 422 connected respectively to I/O ports of the first level RF feed network 430. The first level RF feed network has I/O ports 432 which are connected in turn to the transmit/receive (T/R) module chips 440 mounted on the origami panel circuit board. The radiators 450 are connected to the T/R module chips. Further, the X-band array includes an RF filter/choke 442 for suppressing UHF band signals, connected between each TR module 440 and radiating element 450.

The UHF-band array includes a transmit/receive (T/R) drive circuit 510 connected to an exemplary UHF feed network 520 for a sub-panel array. The T/R drive circuit 510 receives an input drive signal from a UHF exciter such as an UHF-band exciter, and routes received signals from the T/R modules to a receiver circuit such as an UHF-band receiver. The feed network 520 has I/O ports 522 connected respectively to the transmit/receive (T/R) module chips 540. The UHF radiators 550 are connected to the T/R module chips. Further, the UHF-band array includes an RF filter/choke 542 for suppressing X-band signals, connected between each TR module 540 and radiating element 550.

Figure 13:
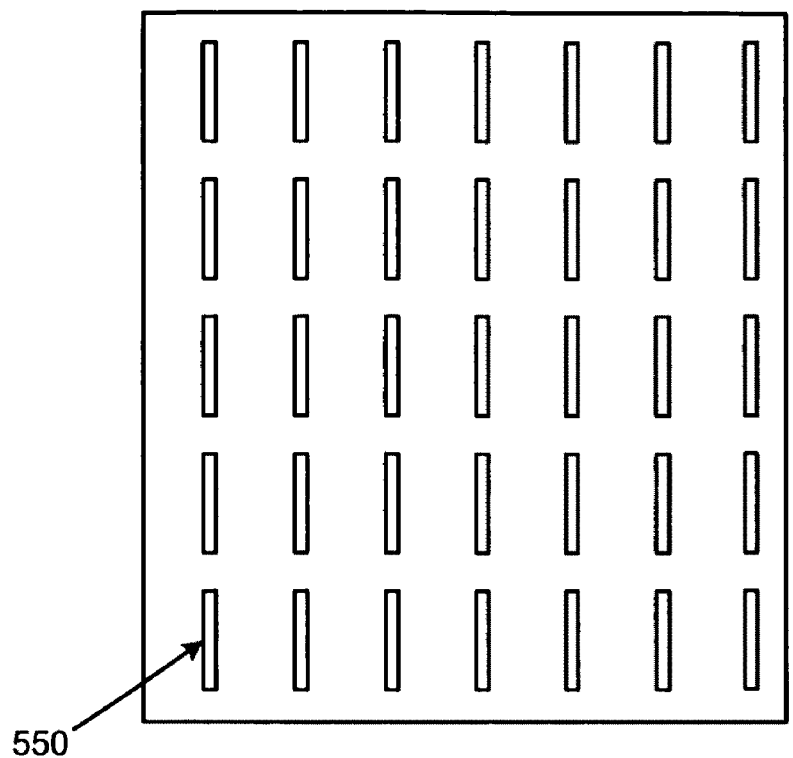
FIG. 13 is a top view illustrating diagrammatically an exemplary embodiment of an array of UHF radiating elements for the dual band array.

An exemplary UHF radiating element suitable for integration with the X-band origami array is the finite slot radiator 550, diagrammatically illustrated in FIG. 13 as a top view of an array of UHF radiating elements. Finite slot radiators are known in the antenna art; see, e.g., "Antenna Engineering Handbook," Henry Jasik, editor, McGraw-Hill, 1961, pages 8-1 to 8-4. Other radiating elements, such as the long slot and coplanar dipole, may alternatively be employed, and can be integrated into the origami panel while achieving low profile in thickness. In this example, the finite slot elements are each excited by a single probe element, and are located within the layers or structure containing the second level air stripline RF feed network 420, comprising air stripline transmission lines 140 (e.g. as shown in FIG. 2A). The X-band long slot radiator slots may be excited by several spaced probes.

Figure 14:
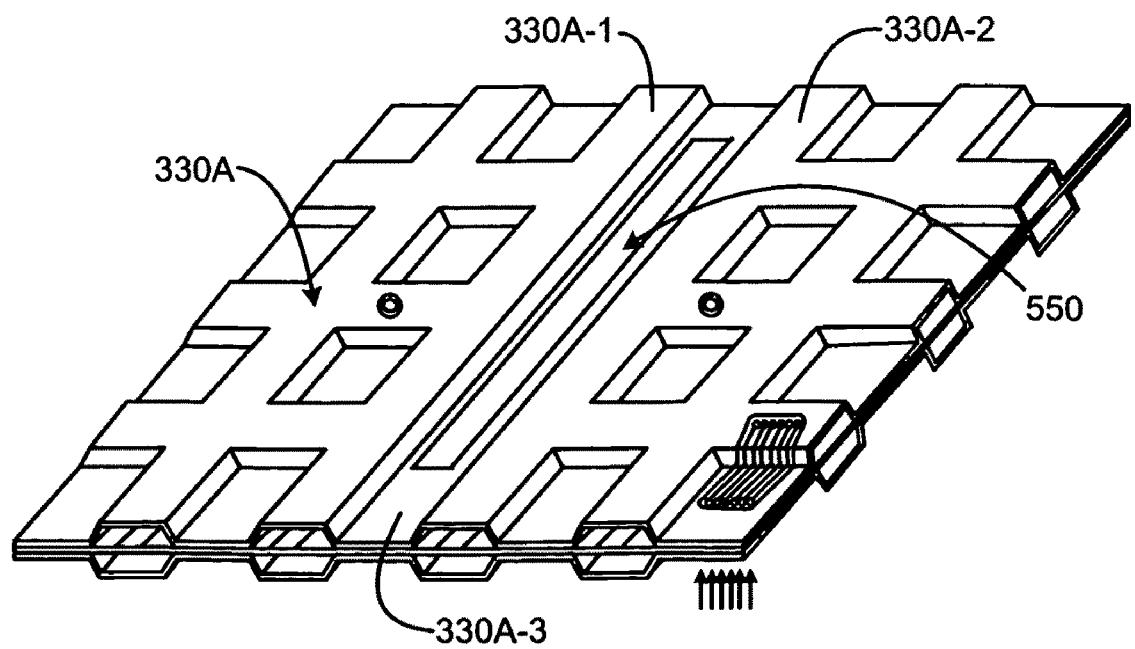
FIG. 14 is an isometric diagrammatic illustration of an exemplary embodiment of a UHF radiating element formed with an air stripline feed network for an X-band subarray.

As illustrated in FIG. 14, the panel structure 330A making up the second level feed network 420 is configured such that the slot elements 550 will reside with the thin flat portions 330A-3 of the panel. In an exemplary embodiment, the slot elements 550 may have a length of one half wavelength at an operating frequency. The structure 330A is similar to structure 330 of FIG. 8, but with elongated air stripline channels 330A-1 and 330A-2 separated by a thin flat portion 330A-3. The walls of the X-band airstripline transmission line channels 330A-1 and 330A-2 are closed off around the UHF slot 550, while a set of plated thru vias 554 (FIG. 16) surround the slot to prevent the UHF signals from leaking into the X-band portion of the panel.

For an exemplary application of the dual band array in an installation of array panels on the outside hull of an airship, the UHF radiating slot element 550 may not employ a waveguide cavity backing behind the panel, thus allowing the thickness of the panel array to remain the same as an X-band panel, e.g. under 1 cm. The UHF slot may be allowed to radiate in both directions with some acceptable reduction in gain. The inclusion of a thin cavity backing (less than 0.025 of a wavelength), as described, e.g., in "Microstrip-Fed Slot Antennas Backed by a Very Thin Cavity," A. Vallecchi and G. B. Gentilli, Ref. Microwave and Optical Technology Letters, Vol. 49, January 2007, pages 247-250, can be incorporated to the slot element as a mechanical standoff to provide clearance between the electronics mounted on the back of the panel and the surface of the airship hull material.

Figure 15:
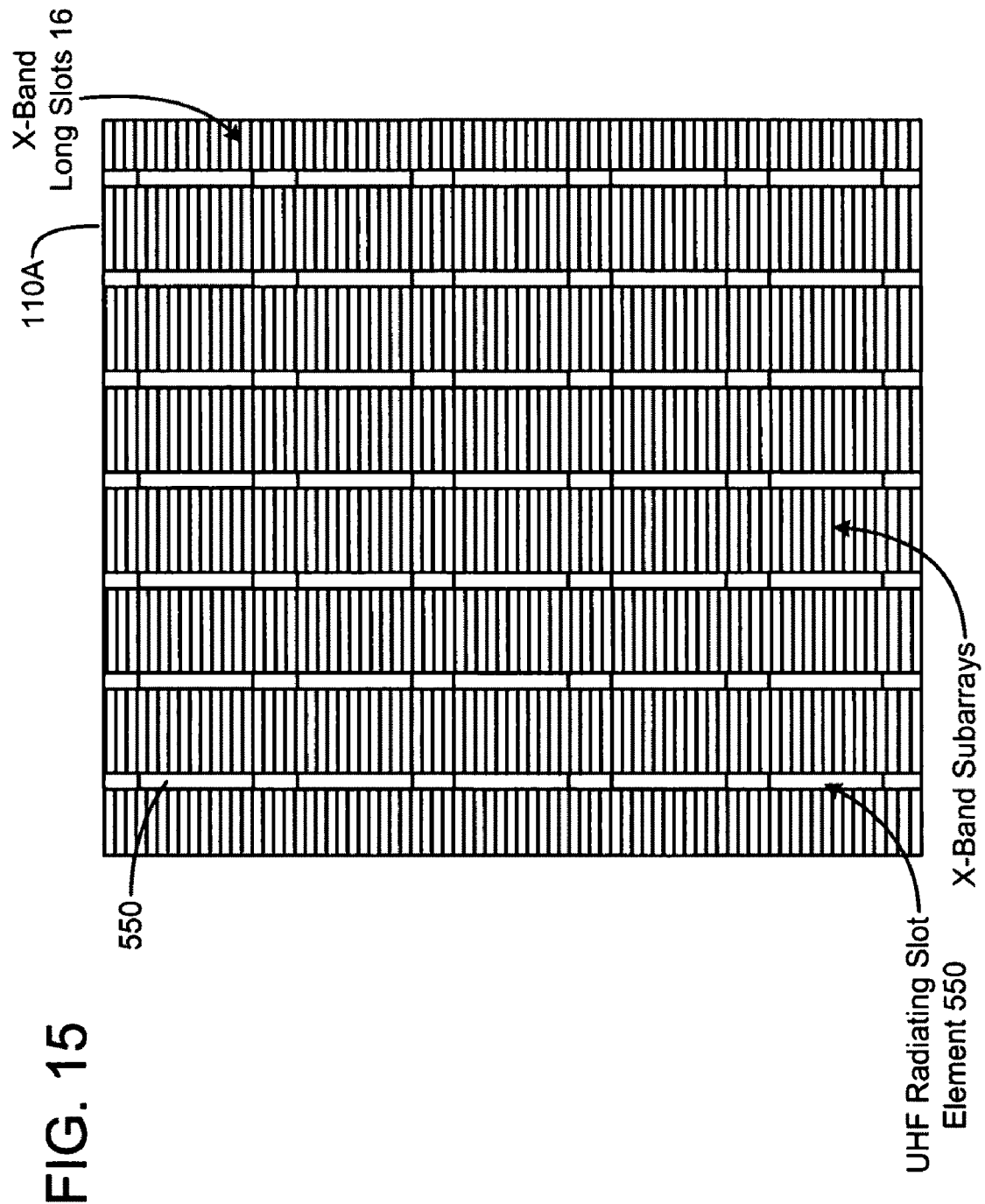
FIG. 15 is a top view illustrating diagrammatically an exemplary embodiment of an array of UHF radiating elements integrated with X-band subarrays of a dual band array
Figure 16:
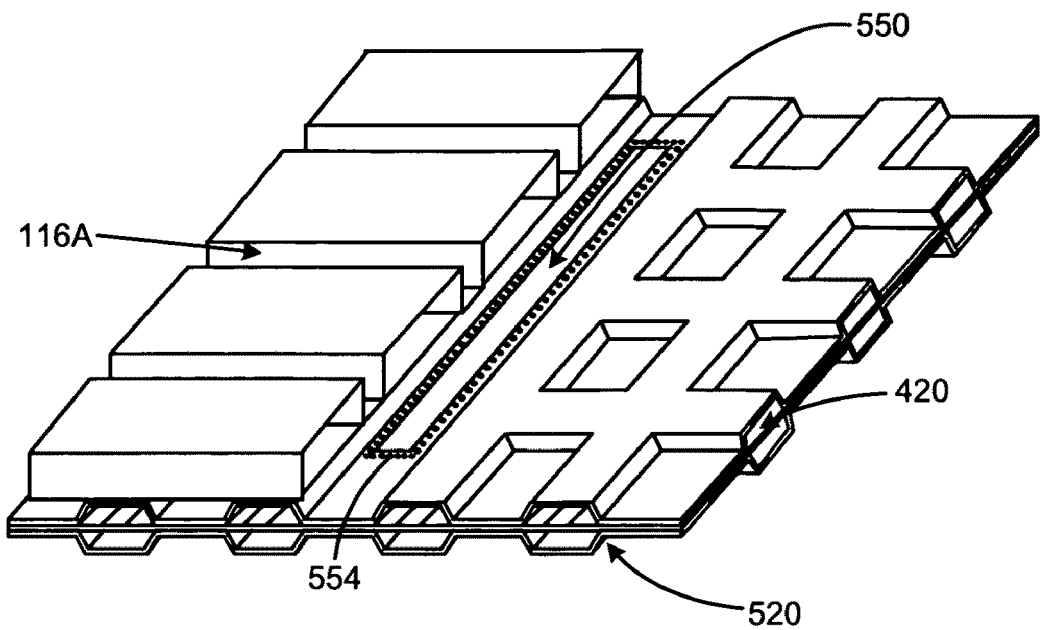
FIG. 16 is an isometric diagrammatic cutaway illustration of an exemplary embodiment of a UHF radiating element formed with an air stripline feed network for an X-band subarray, and showing an array of X-band radiators formed on one side of the UHF radiating element.

FIG. 15 shows the X-band folded active aperture broken up as separate sub-panels or sub-arrays 110A, separated by columns of UHF radiating slots 550. The X-band aperture sub-panels 110A are mounted on the level two RF feed structure 330A (FIG. 14) in such a way as to provide clearance for the UHF slots to radiate into free space. As illustrated in FIG. 16, the X-band long slot elements 116A are oriented orthogonal to the UHF finite slot elements 550. This allows the X-band elements and UHF elements to be cross polarized to electrically isolate them from each other and to minimize leakage interference. A set of plated thru grounding vias 554 surround the slot to prevent the UHF signals from leaking into the X-band portion of the panel. Because of a 20 to 1 frequency ratio between X-band and UHF in this exemplary embodiment, the openings within the folded X-band aperture 110A can be designed to minimized leakage of the UHF onto the X-band portion of the panel. In an exemplary embodiment, conventional RF filtering techniques, implemented as filters 552 (FIG. 12) may be used to prevent leakage of X-band signal onto the UHF portion of the panel. The filters act as bandpass or band stop filters (narrow band) and can be built into the feed networks.

Figure 17:
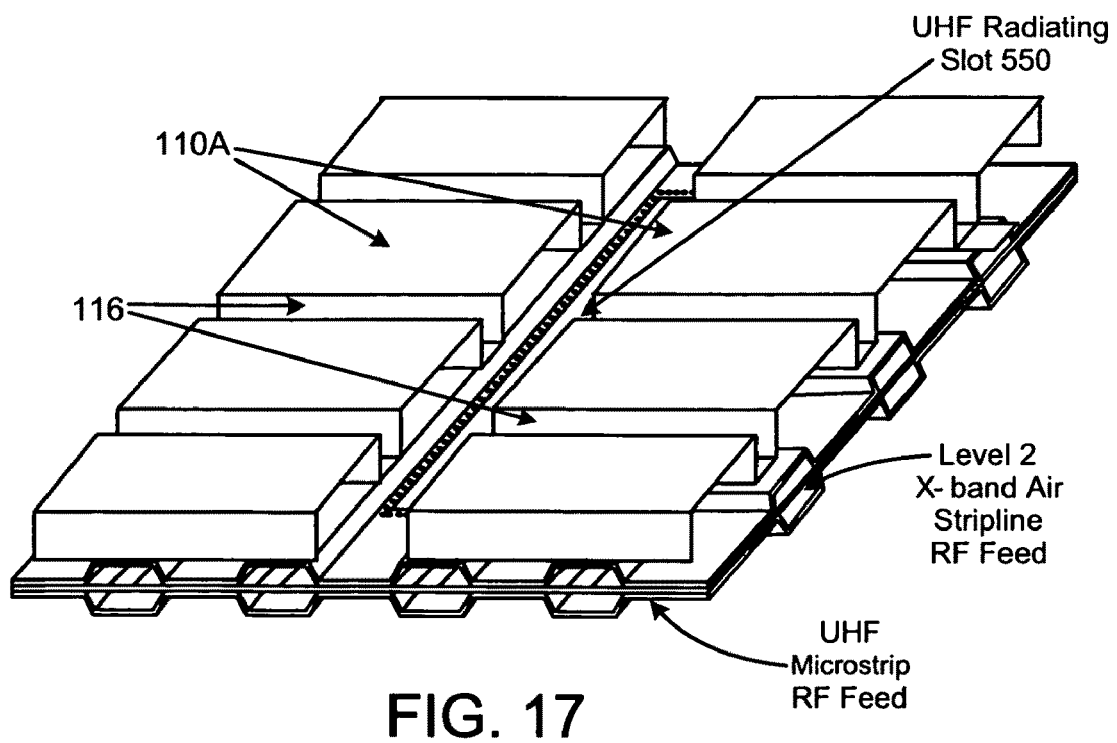
FIG. 17 is an isometric illustration similar to FIG. 16, but showing arrays of X-band radiators on both sides of the UHF radiating element.

FIG. 17 shows the physically separated X-band folded aperture sub-panels 110A mounted on either side of a UHF slot element 550. A physically continuous X-band aperture panel can also implemented to cover the UHF slots, with portions of the copper ground plane of the X-band aperture panel removed to provide clearance allow the UHF slot to radiate.

Figure 18:
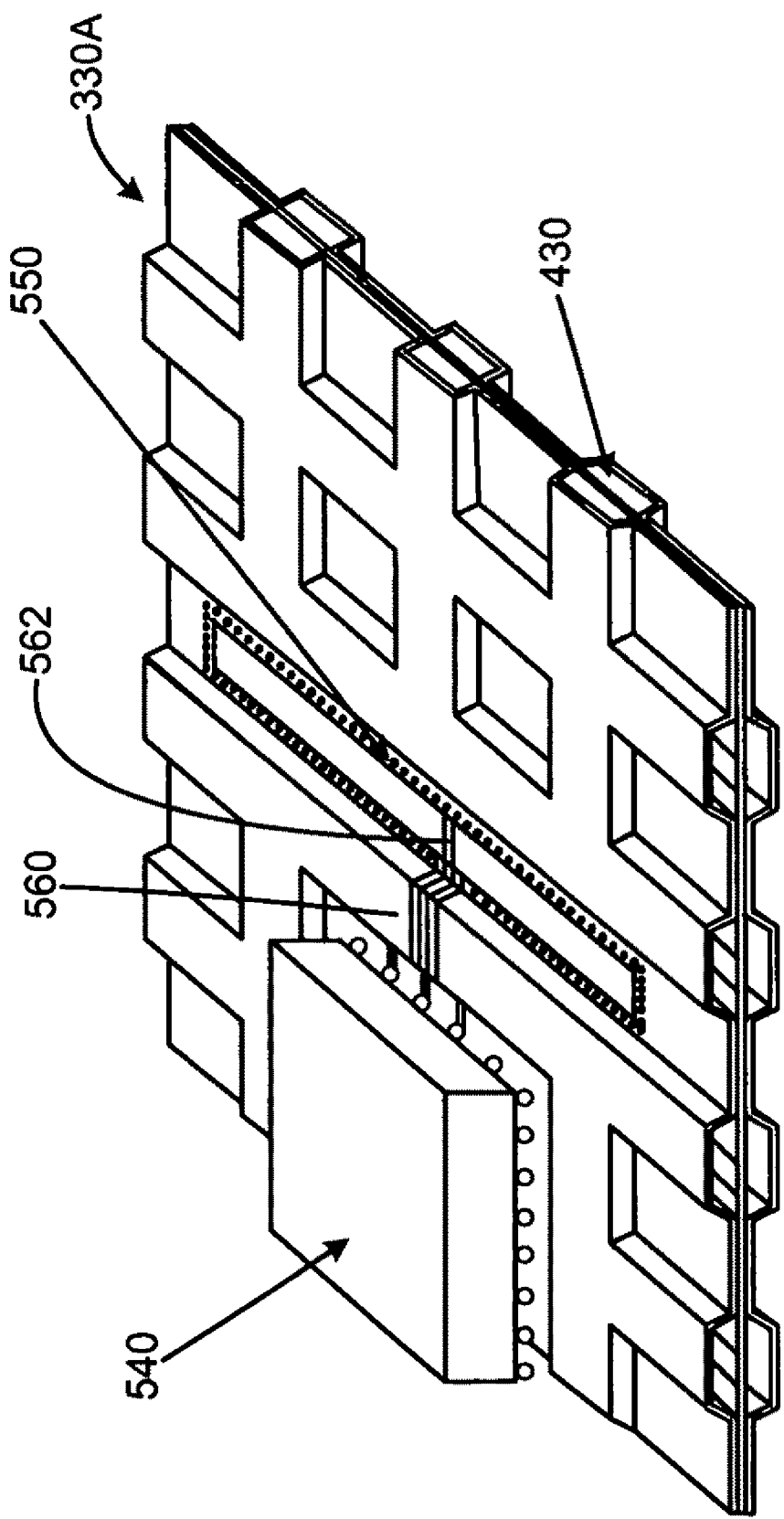
FIG. 18 is an isometric view of the bottom of an exemplary embodiment of an air stripline feed structure for the dual band array, showing an exemplary UHF microstrip RF feed for the UHF radiating element.
Figure 19:
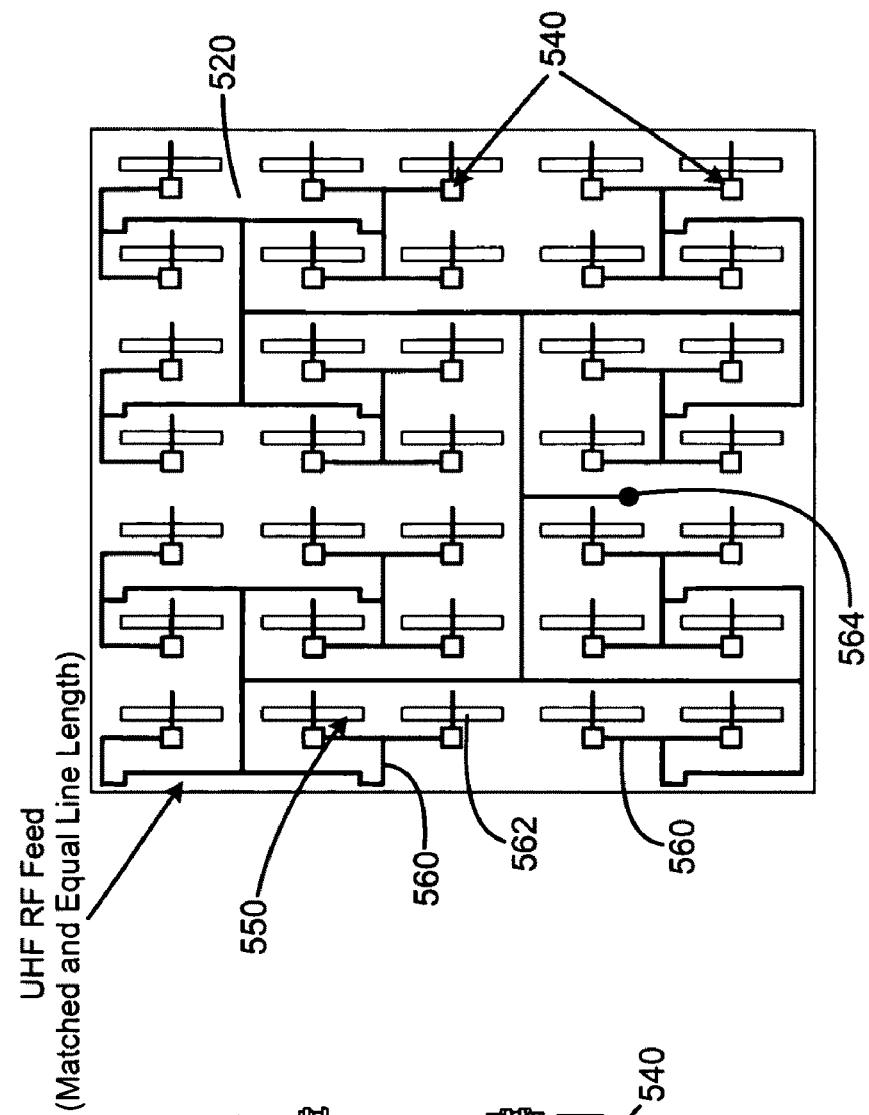
FIG. 19 is a schematic illustration of an exemplary embodiment of an RF UHF feed for an array of UHF radiation elements for a dual band array.
Figure 20:
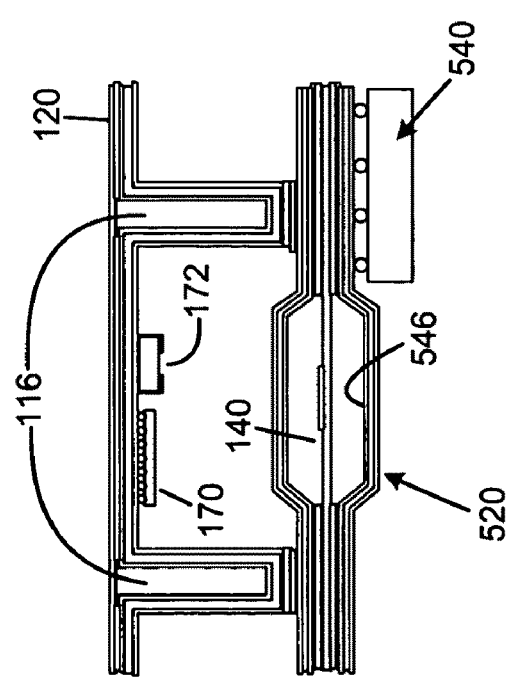
FIG. 20 is a side view illustration of an exemplary embodiment of a dual band array including the UHF feed of FIG. 19.

A UHF microstrip RF feed network or manifold 520 resides on the back of the X-band level two airstripline RF feed structure 330A, as shown in FIGS. 18-20. The X-band second level feed channels are formed using thin flex circuit material with copper cladded on both sides. As shown in FIG. 20, which is similar to FIG. 2A with common reference numbers and with UHF circuit elements added, both the UHF RF feed and X-band RF feed share a common groundplane 546 on one side of the panel. The microstrip conductor pattern for the UHF feed network 560 is formed on the opposed dielectric surface of the panel. Conventional Wilkinson power dividers with thin film resistors may used to divide power from a single input connection 562 on the panel (separate from the X-band). In an exemplary embodiment, with an array lattice spacing around 30.5 cm, there is sufficient room to rout the UHF power and control manifold on the back of the X-band level two RF feed along with the UHF RF feed. FIG. 18 illustrates the UHF microstrip line 562 (FIG. 19) transitioning across the slot element 550 to provide a probe to excite the slot. The microstrip line is not necessarily planar, and the transmission line conforms along the shape of the channels of the X-band second level RF feed 420. The microstrip line allow easy attachment of flip chip devices containing the UHF TR modules 540 and drive function that can be installed, e.g. using standard surface mount manufacturing techniques for printed circuit boards. In an exemplary embodiment, the thin flexible circuit board material may have a thickness less than 0.1 mm, little or no RF energy will leak off the microstrip transmission line due to radiation except at the transition to the UHF slot elements. The microstrip probe 562 is terminated at the end on the opposite side of the slot with an open circuit. At that launch point the microstrip line runs over and across the slot at a predetermined location creating a voltage potential across the slot causing the UHF element to radiate.

Although the foregoing has been a description and illustration of specific embodiments of the subject matter, various modifications and changes thereto can be made by persons skilled in the art without departing from the scope and spirit of the invention as defined by the following claims.

What is claimed is:

1. A dual band antenna array, comprising:
a folded circuit board comprising a dielectric layer and a conductor layer pattern formed on a first surface of the dielectric layer, the circuit board folded in a plurality of folds to form a pleated structure defining a first array of radiator structures on said first surface, the first array of radiator structures configured for operation in a first frequency band in a first polarization sense;
a second array of radiator structures configured for operation in a second frequency band in a second polarization sense, the second array of radiator structures being on a side of the dielectric layer opposite the first surface, wherein the second frequency band is different from the first frequency band;
a conductor trace pattern formed on the folded circuit board to carry control signals, DC power and RF signals; and
a plurality of active RF circuit devices attached to the folded circuit board in signal communication with said conductor trace pattern.

2. The array of claim 1, wherein:
said first frequency band is an X-band frequency band; and
said second frequency band is a UHF frequency band.

3. The array of claim 1, wherein:
said first polarization sense is orthogonal to said second polarization sense.

4. The array of claim 1, wherein the first array of radiator structures is linearly polarized, and the second array of radiator structures is linearly polarized.

5. The array of claim 1, wherein the conductor layer pattern includes a ground plane portion, and said first array of radiator structures includes an array of long slot radiator structures formed by open slot regions defined in the ground plane portion parallel to said plurality of folds.

6. The array of claim 1, wherein the folded circuit board includes an RF feed network defined by the conductor trace pattern.

7. The array of claim 6, further comprising a circuit laminate structure including a second feed network attached to the folded circuit board such that the second feed network is in electrical communication with the RF feed network.

8. The array of claim 7, wherein the second array of radiator structures is defined by the circuit laminate structure.

9. The array of claim 8, wherein the second array of radiator structures comprises a set of slots having respective longitudinal extents arranged along a common axis which is transverse to the folds in the pleated structure.

10. The array of claim 9, wherein the conductor layer pattern includes a ground plane portion, and said first array of radiator structures includes an array of long slot radiator structures formed by open slot regions defined in the ground plane portion parallel to said plurality of folds.

11. A dual band antenna array, comprising:
a circuit laminate sheet comprising a dielectric layer and a conductor layer pattern formed on a first surface of the dielectric layer, the circuit laminate sheet folded in a plurality of folds to form a pleated structure defining a first array of radiator structures on the first surface and having a first polarization sense, and a first conductor trace pattern formed on a second surface of the dielectric layer defining a first feed network for said first array of radiator structures;
a plurality of active RF circuit devices attached to the second surface of the dielectric layer in signal communication with said first conductor trace pattern;
a circuit laminate structure attached to said circuit laminate sheet at folds of said pleated structure and including a second conductor trace pattern, said attachment of said laminate structure to said folds of said pleated structure resulting in electrical connection between said first conductor trace pattern and said second conductor trace pattern; and
a second array of radiator structures formed by said circuit laminate structure on a side of the dielectric layer opposite the first surface, and having a second polarization sense orthogonal to said first polarization sense,
the first array of radiator structures and the second array of radiator structures operating in different frequency bands.

12. The array of claim 11, wherein circuit laminate sheet structure includes a second RF feed network for the first array of radiator structures, and a first RF feed network for the second array of radiator structures.

13. The array of claim 12, wherein the second RF feed network includes an air stripline feed circuit or a suspended microstrip feed circuit, and the first RF feed network for the second array of radiator structures includes a microstrip feed circuit, and wherein the second RF feed network is isolated from the microstrip feed circuit by a ground plane layer.

14. The array of claim 13, wherein the first array of radiator structures includes an array of long slot radiator structures, and the second array of radiator structures includes an array of finite slot radiator elements arranged orthogonally to the array of long slot radiator structures.

15. The array of claim 14, further comprising a plurality of transmit/receive (T/R) module devices for the second array of radiator structures attached to the circuit laminate structure.

16. The array of claim 11, further comprising a radome structure attached to said circuit laminate sheet so that said circuit laminate sheet is sandwiched between said radome structure and said circuit laminate structure.

17. The array of claim 11, wherein:
said first array operates at an X-band frequency band; and
said second array operates at a UHF frequency band.

18. A dual band active array system, comprising:
a circuit laminate structure;
a plurality of sub-arrays, each including:
a folded circuit board comprising a dielectric layer and a conductor layer pattern formed on a first surface of the dielectric layer, the circuit board folded in a plurality of folds to form a pleated structure;
a first array of radiator structures on said first surface configured for operation in a first frequency band in a first polarization sense;
a plurality of active RF circuit devices configured for operation with the first array of radiator structures attached to the dielectric layer in signal communication with said conductor layer pattern;
the plurality of sub-arrays attached to the circuit laminate structure at the plurality of folds of the respective folded circuit boards in spaced relation defining open regions between adjacent subarrays;
a second array of radiator structures formed by said circuit laminate structure in said open regions and having a second polarization sense orthogonal to said first polarization sense; and
a second plurality of active RF circuit devices configured for operation with the second array of radiator structures attached to the circuit laminate structure,
the first array of radiator structures and the second array of radiator structures operating in different frequency bands.

19. The array of claim 18, wherein:
said first array operates at an X-band frequency band; and
said second array operates at a UHF frequency band.

20. The array of claim 18 wherein the circuit laminate structure includes an air stripline feed circuit or a suspended microstrip feed circuit for the first array of radiator structures, and a feed network for the second array of radiator structures including a microstrip feed circuit, and wherein the air stripline feed circuit is isolated from the microstrip feed circuit by a ground plane layer.

21. The array of claim 18, wherein the first array of radiator structures includes an array of long slot radiator structures, and the second array of radiator structures includes an array of finite slot radiator elements arranged orthogonally to the array of long slot radiator structures.

22. The array of claim 18, further comprising a radome structure attached to said plurality of sub-arrays so that the plurality of sub-arrays are sandwiched between said radome structure and said circuit laminate structure.

* * * * *